United States Patent [19]
Kawano et al.

[11] Patent Number: 4,815,987
[45] Date of Patent: Mar. 28, 1989

[54] ELECTRICAL CONNECTOR

[75] Inventors: Kyoichiro Kawano; Hiroki Tsuji; Teruo Murase, all of Yokohama, Japan

[73] Assignee: Fujitsu Limited, Kawasaki, Japan

[21] Appl. No.: 136,776

[22] Filed: Dec. 22, 1987

[30] Foreign Application Priority Data

Dec. 26, 1986 [JP] Japan .................................. 61-314970
Jun. 9, 1987 [JP] Japan .................................. 62-143759

[51] Int. Cl.⁴ .......................................... H01R 13/193
[52] U.S. Cl. ................................................... 439/263
[58] Field of Search ................. 439/259, 260, 262–269

[56] References Cited

U.S. PATENT DOCUMENTS

| 3,569,904 | 3/1971 | Hill et al. | 439/260 |
| 4,059,323 | 11/1977 | Babuka et al. | |
| 4,422,703 | 12/1983 | Christensen et al. | 439/266 |
| 4,496,205 | 1/1985 | Christensen et al. | 439/266 |
| 4,575,171 | 3/1986 | Igarashi et al. | 439/267 |
| 4,648,668 | 3/1987 | Sinisi | 439/260 |

FOREIGN PATENT DOCUMENTS 56-7370 1/1981 Japan .

OTHER PUBLICATIONS

IBM Technical Disclosure Bulletin, vol. 22, No. 5, 10/1979; "Zero Insertion Force Module Socket"; Williams, P. E..
AMP Data Sheet No. 76-376, revised 4-78, pp. 15-20 through 15-24.

Primary Examiner—Neil Abrams
Attorney, Agent, or Firm—Staas & Halsey

[57] ABSTRACT

An electrical connector includes a plug having a number of contact pins and a jack having a number of receptacle contacts corresponding to the contact pins. Each of the receptacle contacts has a parallel portion and a widened portion. A contact pressing member having partition walls is movable in such a manner that, when the contact pressing member is in a first position, the partition walls are positioned at the parallel portions of the receptacle contacts to allow an easy insertion of the contact pins. When the contact pressing member is moved to a second position, the partition walls are moved to the widened portions of the receptacle contacts so that the gaps between the widened portions are narrowed. Therefore, the receptacle contacts are pressed into firm contact with the contact pins.

13 Claims, 10 Drawing Sheets

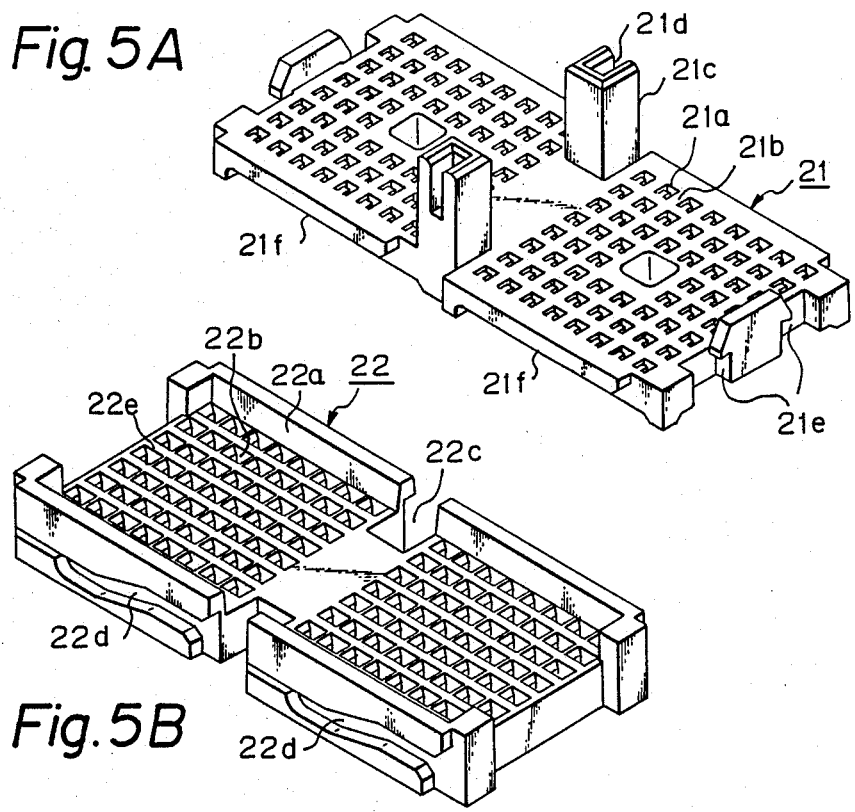
Fig. 5A
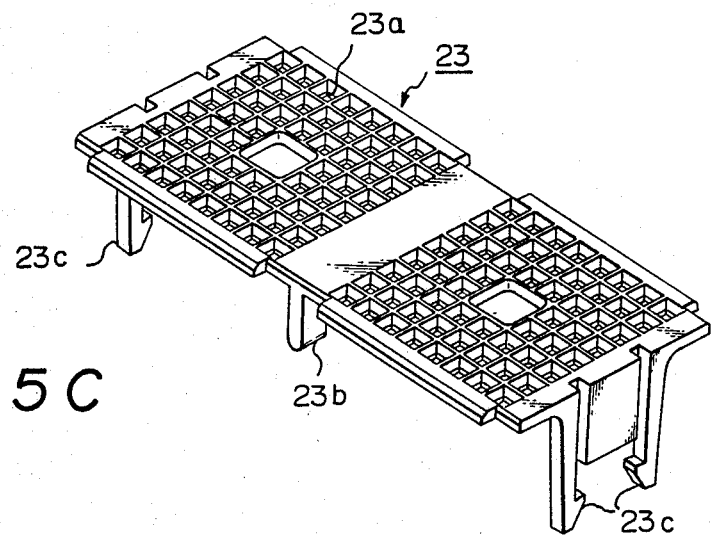
Fig. 5B
Fig. 5C

ELECTRICAL CONNECTOR

BACKGROUND OF THE INVENTION

1. Field of the Invention

This invention relates to a connector used in the electric or electronic fields and, more particularly, to an electrical connector comprising a plug assembly having a large number of contact pins and a jack assembly having a large number of receptacle contacts corresponding to the contact pins.

In recent years, electronic instruments such as computers have become very sophisticated, and accordingly, the number of output terminals of such computers has been greatly increased. Therefore, a connector having a large number of pins or contacts is required in this field. Such a connector must be capable of being handled by an operator, and stably connected to a corresponding connector in such a manner that only a small force is necessary when one connector is engaged with or disengaged from the other connector.

2. Description of the Related Art

A known electrical connector comprises a plug assembly having a large number of contact pins and a jack assembly having a large number of receptacle contacts corresponding to the contact pins. Namely, the plug comprises a large number of contact pins regularly arranged and rigidly secured to a board to constitute a pin array. The jack assembly comprises a large number of receptacle contacts, each usually having a pair of contact portions, and a molded body having a large number of compartments and guide slots corresponding to the array of contact pins. The pairs of contact portions of the receptacle contacts are accommodated in the compartments. When the plug is engaged with the jack, the contact pins of the plug are inserted through the respective guide slots into the compartments i.e., the gaps formed between the pairs of contact portions, in such a manner that the contact pin widens the gap of the contact portions and comes into sliding contact with the contact portions.

However, a conventional connector as mentioned above has several drawbacks. For example, the force for inserting the contact pins into the jack is also used for widening the gaps between the pairs of contact portions, and therefore, if the number of contact pins is increased, the plug insertion force must be also increased. This plug insertion force is exerted directly on the contact pins and receptacle contacts, i.e., on the plug and jack assemblies, so that the parts and materials constituting these assemblies must be strengthened. In addition, if the number of contact pins is further increased, it becomes difficult to uniformly apply a large plug insertion force at all areas of the jack or plug assemblies. This also increases the possibility of damage to or deformation of the contact pins or receptacle contacts.

SUMMARY OF THE INVENTION

An object of the present invention is to provide an electrical connector comprising a plug and a jack and having multiple pin contacts and receptacle contacts, whereby a plug insertion force is significantly reduced, so that a connecting operation can be easily performed.

Another object of the present invention is to provide an electrical connector which is capable of maintaining a large contact force between the contact pins and contact receptacles while the plug is engaged with the jack.

According to the present invention there is provided a electrical connector comprising: (a) a plug assembly having a number of contact pins and (b) a jack assembly including a number of receptacle contacts corresponding to the contact pins, each of the receptacle contacts defining a gap opening at a top thereof into which the contact pin can be resiliently inserted, so that the contact pins simultaneously come into electrical contact with the receptacle contacts, each of the receptacle contacts having at least one parallel portion and a widened portion in which the width of the gap is larger than that in the parallel portion; and a contact pressing member having partition walls and being movable between first and second positions in such a manner that, when the contact pressing member is in the first position, the partition walls are positioned at the parallel portions of the receptacle contacts so that the gaps therein allow an easy insertion of the contact pins and, when the contact pressing member moves to the second position, the partition walls are moved to the widened portions of the receptacle contacts so that the gaps therein are narrowed in such a manner that the receptacle contacts are in firm contact with the contact pins; and (c) means for moving the contact pressing member between the first and second positions thereof.

Thus, a multiple pin and receptacle contacts type electrical connector can be obtained by which a plug insertion force is significantly reduced and, therefore, a connecting operation can be easily performed. In the connected state, a large and uniform contact force is maintained between the pin contacts and the receptacle contacts.

The present invention also provides an electrical connector comprising: (a) a plug assembly including a board and a number of contact pins regularly arranged on the board; and (b) a jack assembly including a mother board and a plurality of jack modules regularly arranged on the mother board, each of the jack modules comprising: a housing fixed on the mother board; a number of receptacle contacts regularly arranged on the housing corresponding to the contact pins, each of the receptacle contacts projecting from the housing and defining a gap opening at the top thereof, the receptacle contacts also having a widened portion adjacent to the tops and at least one parallel portion adjacent to the widened portion thereof, the width of the gaps at the widened portions being larger than the width at the parallel portions; a pin guide fixed to the housing and having a number of guide holes corresponding to the number of contact pins, so that the contact pins can be simultaneously inserted through the guide holes and come into resilient contact with the receptacle contacts; a contact pressing member having partition walls and slidingly mounted on the housing between the upper and lower position thereof in such a manner that, when the contact pressing member is in the lower position, the partition walls are positioned at the parallel portions of the receptacle contacts so that the gaps therein allow an easy insertion of the contact pins and when the contact pressing member moves to the upper position, the partition walls are moved to the widened portions of the receptacle contacts so that the gaps therein are narrowed in such a manner that the pin contacts are pressed into firm contact with the receptacle contacts; and the contact pressing member is provided at both side walls thereof with inclined guide grooves, respectively; and (c) means for moving the contact pressing member comprising: a plurality of sliding members slidably mounted on the mother board, each of the sliding members having projections which are engaged with the inclined guide grooves of the contact pressing member; and a plurality of cam levers pivotally mounted on the mother board, each of the cam levers having one end engaged with one or more of the sliding members; and (d) a detachable operating means for pivotally moving the one or more cam levers, whereby the contact pressing members are moved up and down by the movement of the cam levers and the sliding members, and thus each contact pressing member can be easily moved up and down by using the detachable operating means. In this case, all of or a group of the jack modules are connected simultaneously by the operation means, and after the insertion of the jack assembly, this operating means can be removed so that the provision of a particular space for this purpose becomes unnecessary.

BRIEF DESCRIPTION OF THE DRAWINGS

FIGS. 5A, 5B, and 5C are perspective views of a housing, a contact pressing member, and a guide member collectively constituting a jack module;

DETAILED DESCRIPTION OF THE PREFERRED EMBODIMENTS

Figure 1:
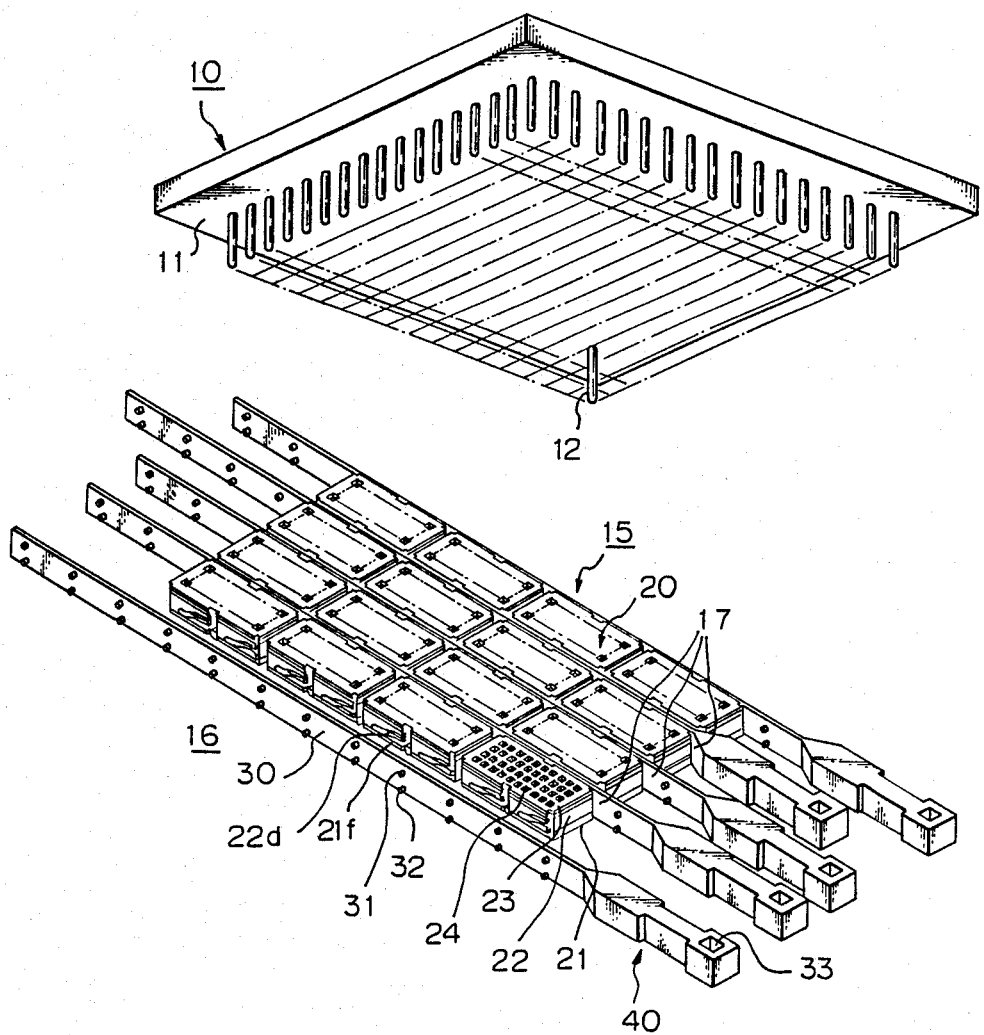
FIG. 1 is a perspective view illustrating a first preferred embodiment of an electrical connector according to the present invention.
Figure 2:
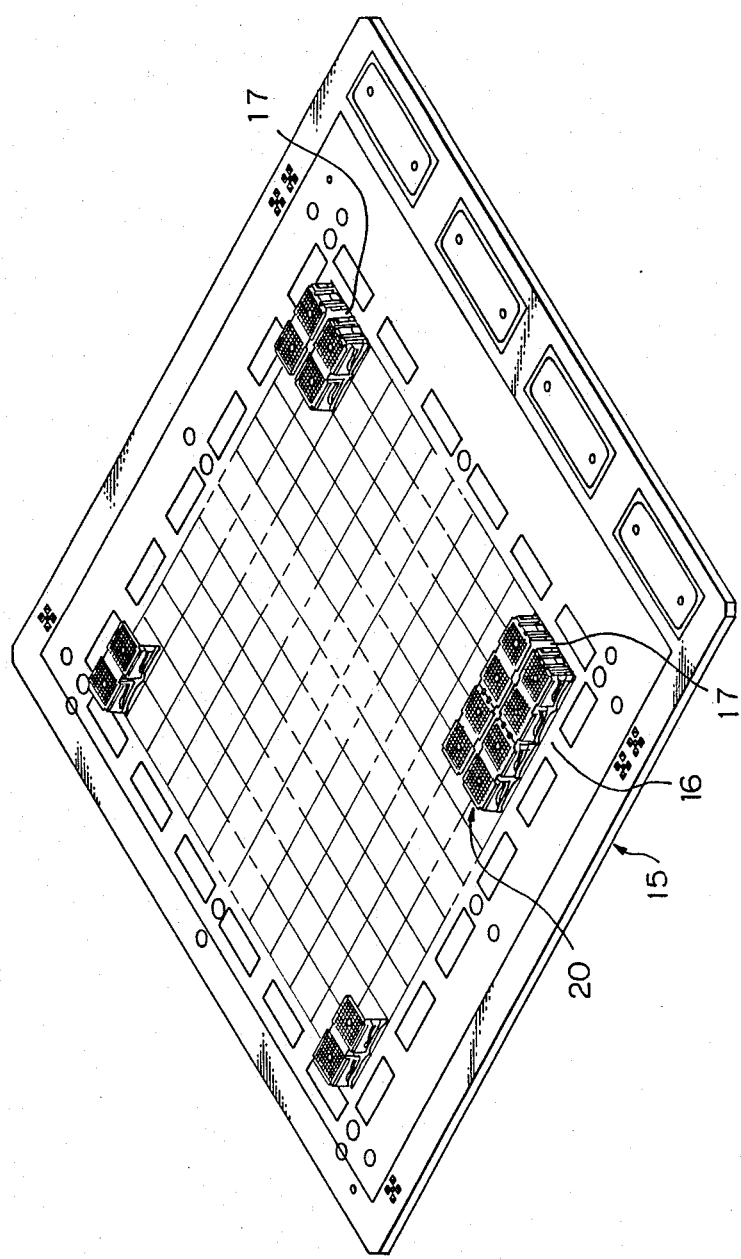
FIG. 2 is a perspective view of a jack assembly used in the FIG. 1 embodiment.
Figure 3:
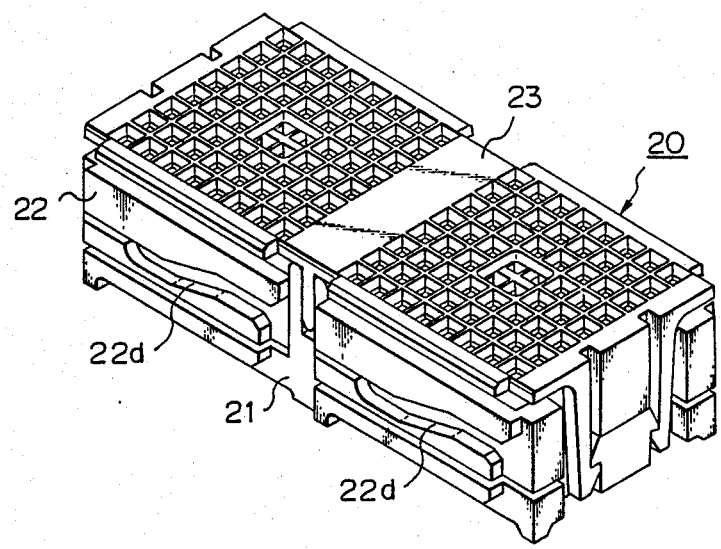
FIG. 3 is a perspective view of a jack module used in the FIG. 1 embodiment.

Referring now to FIG. 1, a plug assembly 10 comprises a board 11 to which a large number of contact pins 12 are rigidly secured. These pins 12 are regularly arranged and constitute a pin array. A jack assembly 15 comprises a plurality of jack modules 20 regularly arranged and fixed on a mother board 16 (FIG. 2). Each module 20 (FIG. 3) comprises a housing 21, a contact pressing member 22, and a pin guide 23, all of which are molded of plastic, and a plurality of receptacle contacts 24.

Figure 4:
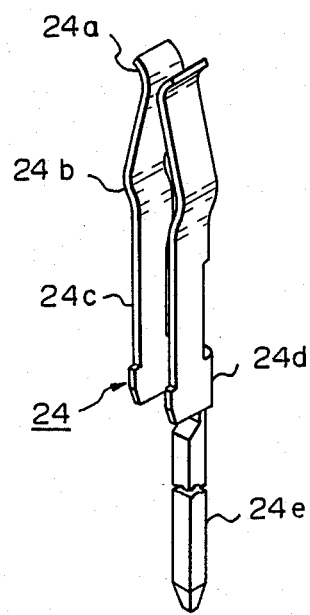
FIG. 4 is a perspective view of a receptacle contact used in the FIG. 1 embodiment.

Each receptacle contact 24 (FIG. 4) consists of a relatively long metal piece having a pair of leaves extending upward from the housing 21, and comprising pairs of contact portions 24a, widened portions 24b, and parallel straight portions 24c, a U-shaped base portion 24d and a lower extending portion 24e. The contact portions 24a opened to the top are slightly diverged to facilitate the insertion of the contact pin 12. The gap between the widened portions 24b is wider than the gap between this parallel straight portions 24c.

Figure 7:
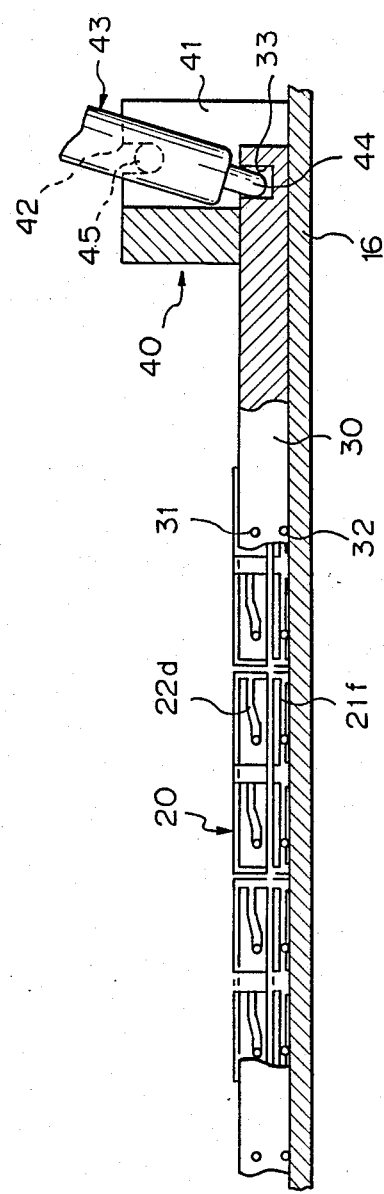
FIG. 7 is a partial side view, shown in cross-section, illustrating a means for causing up and down movement of the contact pressing member used in the FIG. 1 embodiment.

The housing 21 (FIG. 5A) fixed on the mother board 16 has a plurality of regularly arranged compartments 21a separated by partition walls 21b (FIG. 7). Each receptacle contact 24 is inserted into a compartment 21a in such a manner that the U-shaped base portions 24d is fixed in the compartments 21a, whereas the lower portion 24e extends downwardly from the housing 21 and the upper portions 24a, 24b, and 24c extend upwardly therefrom. The housing 21 is provided at the both sides thereof with a pair of vertical columns 21c having vertical recesses 21d, with two pairs of hooks 21e, at the front and rear ends thereof and two pair of horizontal guide grooves 21f at both sides thereof.

The contact pressing member 22 (FIG. 5B) has an upper opening 22a and a plurality of regularly arranged holes 22b corresponding to the compartments 21a of the housing 21 for receiving the receptacle contacts 24. The contact pressing member 22 is provided at both sides thereof with a pair of vertical grooves 22c which fit the vertical columns 21c of the housing 21, respectively, so that the contact pressing member 22 is vertically slidable up and down the housing 21. When the contact pressing member 22 is moved down, the holes 22b (partition walls 22e define these holes 22b) are positioned at the parallel straight portions 24c of the receptacle contact 24. On the other hand, when the contact pressing member 22 is pulled up, the holes 22a (partition walls 22e) are positioned at the widened portions 24b of the receptacle contact 24 so as to narrow the gap between the pair of contact portions 24a. When the contact pressing member 22 is in the lower position, the gap between the pair of contact portions 24a is slightly smaller than the diameter of the contact pin 12, and accordingly, a contact force $F_1$ for inserting the contact pin 12 at this position is far smaller than a contact force $F_2$ in which the gap between the contact portions 24a is narrowed by moving the contact pressing member 22 upward ($F_1 << F_2$). The contact pressing member 22 is provided at both sides thereof with two pairs of cam grooves 22d which are inclined with respect to the horizontal guide groove 21f of the housing 21.

The contact pin guide 23 (FIG. 5C) also has a plurality of regularly arranged holes 23a corresponding to the holes 22a of the contact pressing member 22 into which the contact pins 12 of the plug assembly 10 can be inserted. The contact pin guide 23 is provided at both sides thereof with a pair of vertical projections 23b which fit into the vertical recesses 21d of the housing 21 and, at the front and rear ends thereof, with two pairs of jaws 23c which engage with the hooks 21e of the housing 21, so that the guide member 23 is thus fixedly attached to the housing 21.

Figure 6:
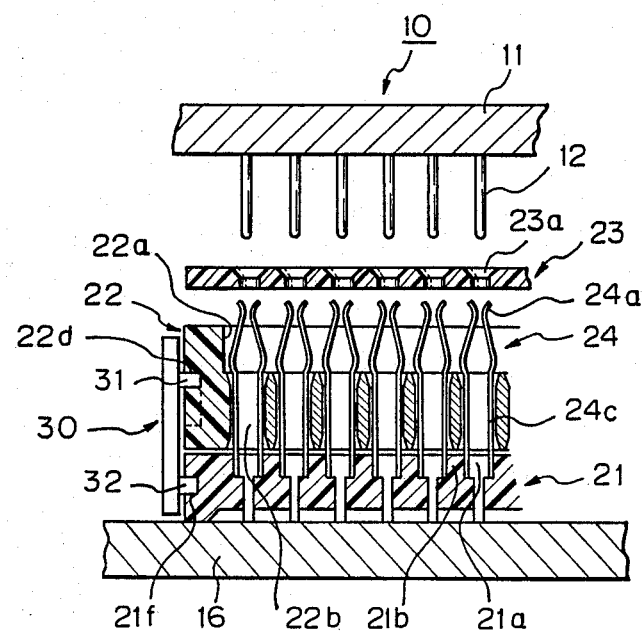
FIG. 6 is a partial cross-sectional view of the electrical connector shown in FIG. 1.

The means 40 for moving the contact pressing member 22 up and down will now be described with reference to FIGS. 1, 6, and 7. Movably arranged in each gap 17 formed between the longitudinal rows of jack modules 20, are a longitudinal sliding members 30 having a plurality of upper and lower projections 31 and 32, which are engaged with the cam grooves 22d of the contact pressing member 22 and the guide grooves 21f of the housing 21, respectively. These sliding members 30 are also arranged along the side faces of the left- and rightmost rows of the jack modules 20, respectively. Accordingly, since the guide grooves 21f are straight but the cam grooves 22d are gradually inclined downward to the front, when the sliding members 30 are moved forward, the contact pressing member 22 is moved upward.

Each sliding member 30 is provided at the rear end thereof with open hole 33, and in the vicinity thereof, a bearing block 41 having a bearing groove 42 is fixed on the mother board 16. A tool 43 having a protrusion 44 insertable into the hole 33 of the sliding member 30 and a pair of legs 45 engageable with the bearing grooves 42 of the adjacent two blocks 41 is provided. Therefore, when the plug assembly 10 is to be inserted into the jack assembly 15, the tool 43 is engaged with the blocks 41 and the protrusion 44 is inserted into the hole 33, so that the sliding members 39 is slidably moved.

Figures 8A, 8B, 8C:
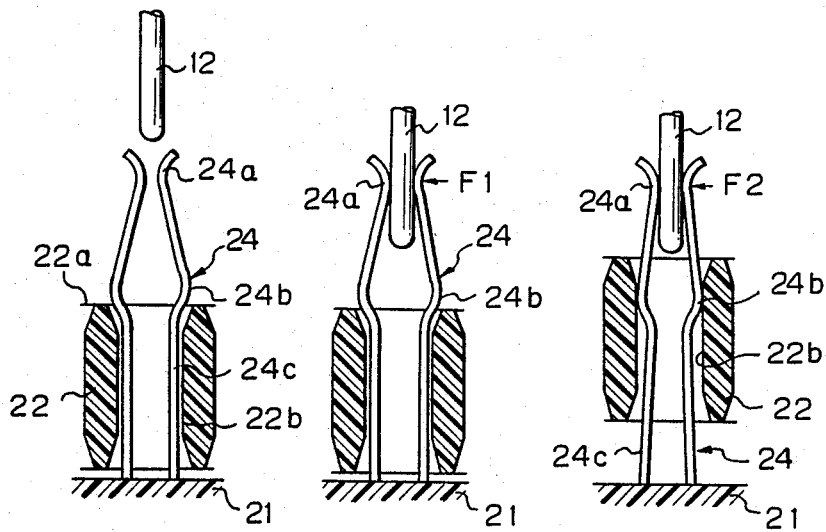
FIGS. 8A, 8B, and 8C are schematic views for explaining the operation of the connector of the FIG. 1 embodiment.

The operation of the connector of this invention will now be described with reference to FIGS. 8A, 8B, and 8C. Before insertion of the contact pins 12, the sliding members 30 are in the rearward position. Therefore, the upper projections 31 are positioned at an upper portion of the inclined cam grooves 22d, so that the contact pressing member 22 is in the lower position, the holes 22b (partition wall 22e) thereof are fitted only on the parallel portions 24c of the receptacle contacts 24, and the wide portions 24b of the receptacle contacts 24 freely lie within the openings 22a of the contact pressing member 22, as shown in FIG. 8A.

In this state, the plug assembly 10 is lowered in such a manner that the plug contact pins 12 are inserted through the holes 23a of contact pin guides 23 into the jack modules 20. Then each contact pin 12 is inserted into the gap between the pair of contact portions 24a of the receptacle contacts 24, as shown in FIG. 8B. In this state, the pair of receptacle contacts (including portions 24a, 24b, and 24c) are supported, in a cantilever fashion, on the housing 21 and, therefore, the contact force $F_1$ (force exerted on the contact pin 12) is so small that a large number of contact pins 12 can be easily, simultaneously inserted into the jack modules 20 with a relatively small insertion force and slidingly moved along the contact portions 24a, to thereby effectively rid the contact pins 12 and receptacle contacts 24 of any contamination thereon. Thus, an effective cleaning can be attained by a slight friction exerted between the contact pin 12 and the receptacle contact 24 by the contact force $F_1$.

After insertion of the plug assembly 10, the tool 43 (FIG. 7) is set on the bearing blocks 41 to move the sliding member 30 forward. Thus the upper projection 31 thereof is brought into contact with a lower portion of the inclined cam groove 22d, so that the contact pressing member 22 is moved to the upper position, as shown in FIG. 8C. Therefore, the hole 22b (partition wall 22e) moves upward to the widened portions 24b of the contact 24 and narrows the gap therebetween. The top contact portions 24a are strongly pushed (force $F_2$) against the plug contact pin 12 and brought into firm contact with the contact pin 12, and thus, plug insertion is completed. Thereafter, the contact pressing member 22 is kept at the upper position, and thus firm contact between the receptacle contact 24 and the plug contact pin 12 is maintained.

When the plug assembly 10 is to be disengaged from the jack modules 20, the sliding member 30 is first moved backward to lower the contact pressing member 22. Then the plug assembly 10 is raised from the jack assembly 15 in an opposite manner as to that described above, for the engagement of the plug assembly 10.

Figure 9:
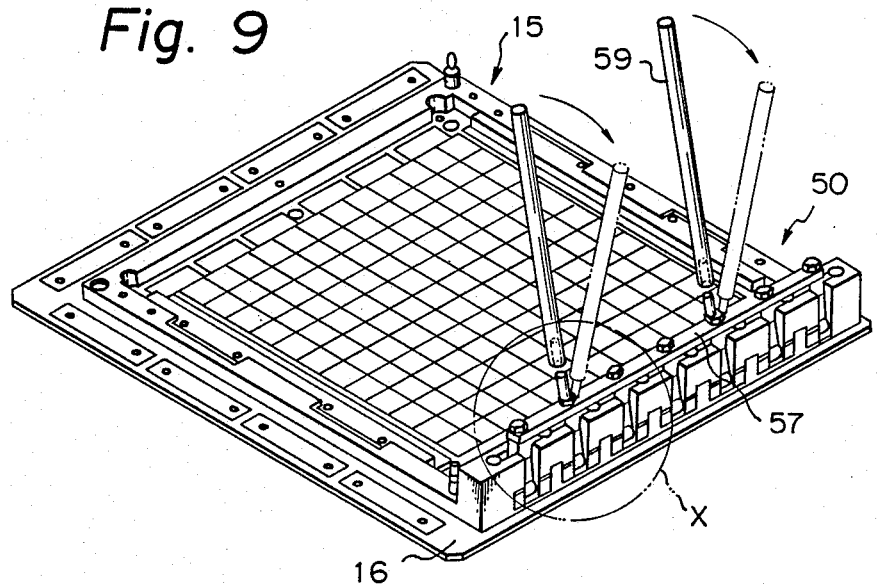
FIG. 9 is a perspective view of a jack assembly of a second, preferred embodiment of present invention.
Figure 10:
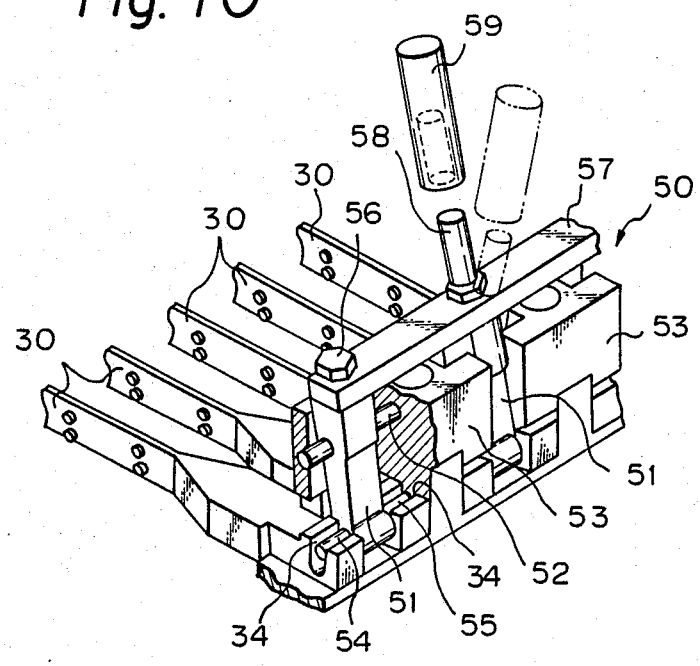
FIG. 10 is an enlarged perspective view of a portion X in FIG. 9.
Figure 11:
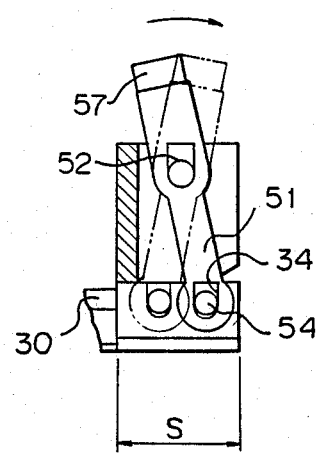
FIG. 11 is a schematic view for explaining an operation of a cam lever used in the embodiment shown in FIGS. 9 and 10.

Another embodiment of the means 50 for moving the sliding members 30 is shown in FIGS. 9, 10, and 11. In this embodiment, the sliding member 30 has a groove 34 at the rear end thereof and, in the vicinity thereof, a cam lever 51, provided for each adjacent two of the sliding members 30, is pivotably mounted by a shaft 52 on adjacent bearing blocks 53, which are arranged between the cam levers 51 and fixed on the mother board 16. The cam lever 51 is provided at the free end thereof with a pair of shafts 54 and 55 projecting from both sides thereof to engage with the grooves 34 of two adjacent sliding members 30, respectively. Each of the grooves 34 has a U-shaped, semicircular cross-section and each of the shafts 54 and 55 has a cylindrical, circular cross-section.

The upper ends of the cam levers 51 are rigidly connected by, for example, bolts 56, to a common connecting bar 57 extending in parallel to the shaft 52. The connecting bar 57 has two tool insert projections 58 extending in the direction opposite to that of the cam levers 51. Two operating tools 59 can be detachably fitted to the projections 58 so that, when the operating tools 59 are pulled in the direction indicated by arrows in FIG. 9, the cam levers 51 are pivotably moved in the clockwise direction (FIG. 11) to move the shafts 54 and 55 forward. Therefore, all of the sliding members 30 are simultaneously moved forward to raise the contact pressing members 22 of the jack modules 20.

According to this embodiment, a dimension(width) of the groove 34 may be smaller than that of the hole 33 (FIG. 7) in the previous embodiments. Therefore, an operating area S may be minimized, since the cylindrical shaft 54, 55 is engaged with the semicircular groove 34. That is, in FIG. 11, when the cam lever 51 is pivotably moved about the shaft 52 in the direction indicated by an arrow, the shaft 54, 55 pushes a wall of the groove 34 and is allowed to turn in the same groove 34. This means that the width of the grrove 34 is sufficient to be very slightly larger than the diameter of the shaft 54, 55 so that the latter can freely turns in the groove 34. Contrary to this, in the embodiment of FIG. 7, the width of the hole 33 must be larger than a distance corresponding to the stroke of the sliding member 30 and, therefore, a larger operating area is required.

Figure 12:
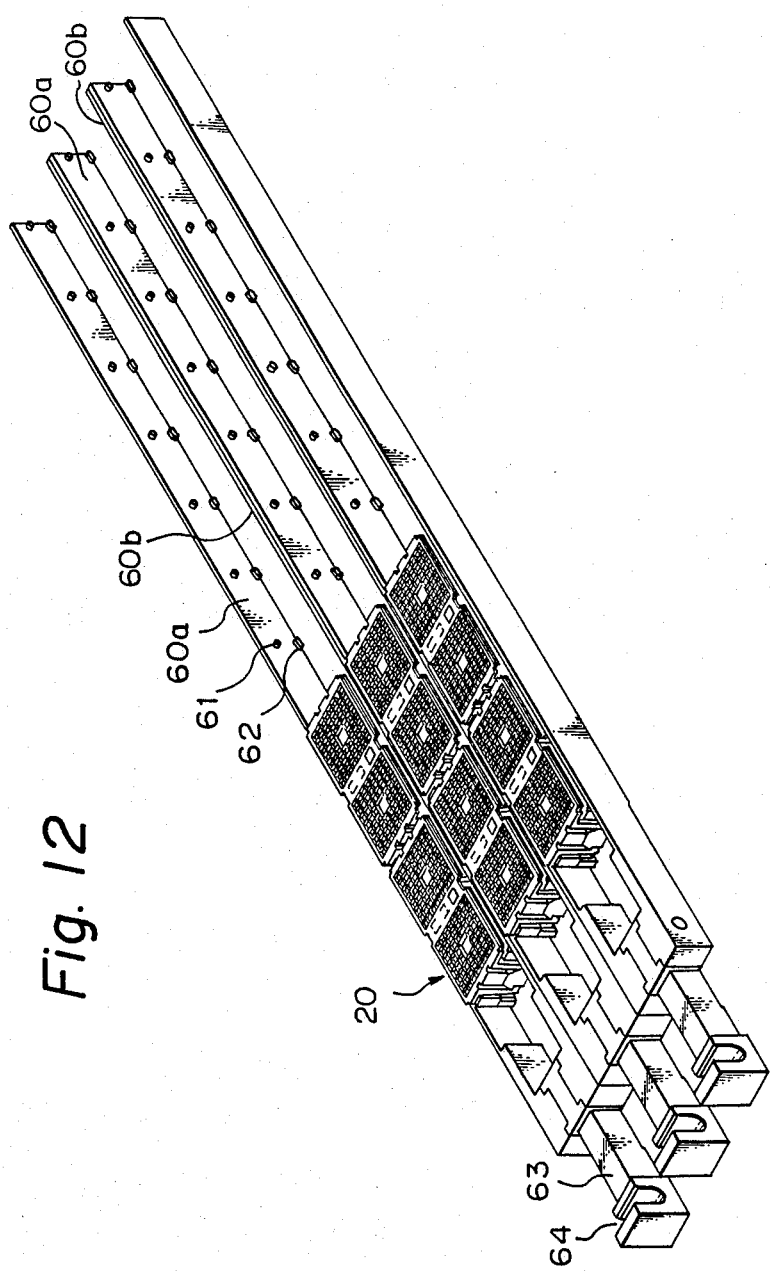
FIG. 12 is a perspective view of jack modules and sliding members in still another embodiment of the invention.
Figure 13:
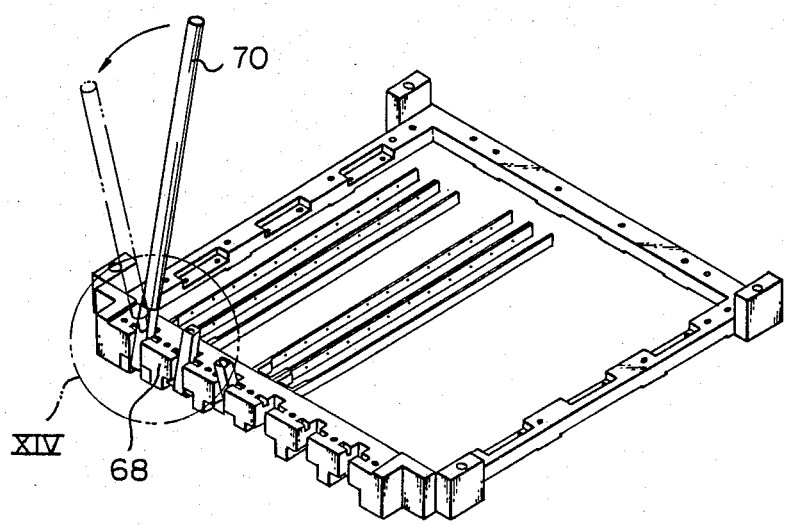
FIG. 13 is a schematic view of a jack assembly in the embodiment shown in FIG. 12; and, FIG. 14 is an enlarged perspective view of a portion XIV in FIG. 13.
Figure 14:
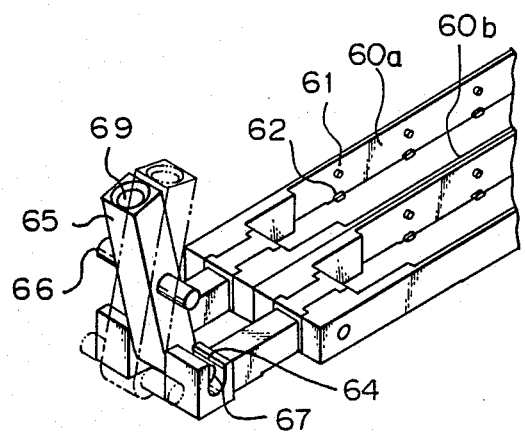

FIGS. 12, 13, and 14 illustrate still another embodiment for moving the contact pressing member 22 up and down. In this embodiment, movably arranged at both sides of the longitudinal rows of the jack modules 20 are pairs of longitudinal sliding members 60a and 60b having a plurality of upper and lower projections 61 and 62 on the inner sides thereof. These projections 61 and 62 are engaged with the cam grooves 22d of the contact pressing member 22 and guide grooves 21f of the housing 21, respectively, in the same manner as in the previous embodiment.

Each pair of sliding members 60a is connected at the rear end thereof to a connecting member 63 having a top opening groove 64 at the rear end thereof, and in the vicinity thereof, a cam lever 65 (FIG. 14), provided for the two adjacent connecting members 63, is pivotably mounted by a shaft 66 on a bearing block 68 (FIG. 13) fixed on the mother board 16 (not shown in FIG. 13). The cam lever 65 is provided at the free end thereof with a pair of shafts 67 projecting from both sides thereof to engage with the grooves 64 of the two adjacent connecting members 63, respectively.

The upper end of each cam lever 65 has a threaded hole 69 to which an operating tool 70 having a threaded projection at one end thereof can be detachably attached, so that when the operating tool 70 is pulled in the direction indicated by an arrow in FIG. 13, the cam lever 65 is pivotally moved independently of the other cam levers 65. Therefore, two pairs of the sliding members 60a and 60b are simultaneously moved forward to raise the contact members 22 of the two rows of jack modules 20. Thus, the operating tool 70 can be used, in turn, for the subsequent cam levers 65 so that two pairs of sliding members 60a and 60b are moved each time.

We claim:

1. An electrical connector comprising:
   (a) a plug assembly having a plurality of contact pins;
   (b) a jack assembly including a plurality of receptacle contacts corresponding to said contact pins, each of said plurality of receptacle contacts defining a first gap opening at a top thereof, into which said contact pins are resiliently insertable, said contact pins simultaneously coming into electrical contact with said receptacle contacts, each of said plurality of receptacle contacts having at least one parallel portion and a widened portion in which the width of a second gap at the widened portion is larger than the width of a third gap between said parallel portions, and a contact pressing member having partition walls and being movable between a first position and a second position, said partition walls being positioned at said parallel portions of the receptacle contacts when said corresponding contact pressing member is in said first position so that the first, second and third gaps between said portions of said receptacle contacts are wide enough to permit insertion of said contact pins with a contact force therebetween, said partition walls being movable to said widened portions of said receptacle contacts when said contact pressing member is moved to said second position so that the second and third gaps are narrowed thereby pressing said receptacle contacts into firm contact with said contact pins and increasing the contact force therebetween; and
   (c) means for simultaneously moving at least a portion of said contact pressing members of said plurality of receptacle contacts between said first position and said second position.

2. An electrical connector as set forth in claim 1, wherein each of said plurality of receptacle contacts comprises a pair of resilient leaves and said first, second and third gaps are defined therebetween.

3. An electrical connector comprising:
   (a) a plug assembly including a board and a plurality of contact pins regularly arranged on said board;
   (b) a jack assembly including a mother board and a plurality of jack modules regularly arranged on said mother board, each of said jack modules including a housing fixed on said mother board; a plurality of receptacle contacts regularly arranged on said housing and corresponding to said contact pins, each of said plurality of receptacle contacts being projected from said housing and defining a first gap opening at a top thereof into which said contact pins are resiliently insertable, said contact pins simultaneously coming into electrical contact with said receptacle contacts, each of said plurality of receptacle contacts having at least one parallel portion and a widened portion in which the width of a second gap at the widened portion is larger than a width of a third gap between said parallel portions, and a contact pressing member having partition walls and being mounted movably with respect to said housing between a first position and a second position, said partition walls being positioned at said parallel portions of the receptacle contacts when said contact pressing member is in said first position, the first, second and third gaps being wide enough to permit insertion of said contact pins with a contact force therebetween, said partition walls being movable to said widened portions of the receptacle contacts to narrow the third gap between said widened portion thereby pressing said receptacle contacts into firm contact with said contact pins and increasing the contact force; and
   (c) means for simultaneously moving at least a portion of said contact pressing members of said receptacle contacts between said first position and said second position.

4. An electrical connector as set forth in claim 3, wherein each of said plurality of receptacle contacts comprises a pair of resilient leaves projecting from said housing, said first, second and third gaps being defined between said pair of leaves.

5. An electrical connector as set forth in claim 3, wherein said housing has means for slidably guiding each of said contact pressing members between said first position and said second position.

6. An electrical connector comprising:
   (a) a plug assembly including a board and a plurality of contact pins regularly arranged on said board;
   (b) a jack including a mother board and a plurality of jack modules regularly arranged on said mother board, each of said jack modules including a housing fixed on said mother board; a plurality of receptacle contacts regularly arranged on said housing and corresponding to said contact pins, each of said receptacle contacts being projected from said housing and defining a first gap opening at a top thereof, each of said receptacle contacts also having a widened portion adjacent to said opening at said top and at least one parallel portion adjacent to said widened portion, a width of a second gap between said widened portions being larger than a width of a third gap between said parallel portions, a contact pin guide fixed to said housing and having a plurality of guide holes corresponding to said contact pins, said contact pins being simultaneously insertable through said guide holes and brought into resilient contact with said receptacle contacts, a contact pressing member having partition walls and being slidingly mounted on said housing to move between an upper position and a lower position, said partition walls being positioned at said parallel portions of the receptacle contacts when said contact pressing member is in said lower position so that the first, second and third gaps between said portion of said receptacle contacts are wide enough to permit insertion of said contact pins with a contact force therebetween and, said partition walls being movable up to said widened portions of the receptacle contacts when said contact pressing member is moved to said upper position so that said second and third gaps are narrowed thereby pressing said plurality of receptacle contacts into firm contact with said contact pins; and (c) means for simultaneously moving at least a portion of said contact pressing members of said receptacle contacts between said upper position and said lower position.

7. An electrical connector as set forth in claim 6, wherein each of said contact pressing members is provided at a side wall thereof with at least one inclined guide groove and said moving means comprises a plurality of sliding members slidably mounted on said mother board, each of said sliding members having projections engagable with said inclined guide grooves of said contact pressing members, said contact pressing members being movable up and down in response to movement of said sliding members.

8. An electrical connector as set forth in claim 7, wherein each of said sliding members is slidably disposed in a fourth gap between said two adjacent jack modules and is provided with said projections on both sides thereof, said projections being engagable with said inclined guide grooves of said two adjacent jack modules.

9. An electrical connector as set forth in claim 6, wherein each of said contact pressing members has two opposite side walls and is provided at both side walls thereof with inclined guide grooves, respectively, and said moving means comprises a plurality of pairs of sliding members slidably mounted on said mother board, each pair of said sliding members having projections engagable with said inclined guide grooves at both side walls thereof, respectively, said contact pressing members being movable up and down in response to movement of said pairs of sliding members.

10. An electrical connector comprising:
(a) a plug assembly including a board and a plurality of contact pins regularly arranged on said board;
(b) a jack assembly including a mother board and a plurality of jack modules regularly arranged on said mother board, each of said jack modules including a housing fixed on said mother board, a plurality of receptacle contacts regularly arranged on said housing and corresponding to said contact pins, each of said plurality receptacle contacts being projected from said housing and defining a first gap opening at a top thereof, each of said plurality of receptacle contacts also having a widened portion adjacent to said top opening and at least one parallel portion adjacent to said widened portion, a width of a second gap at said widened portion being larger than a width of a third gap at said parallel portion, a contact pin guide fixed to said housing and having a plurality of guide holes corresponding to said contact pins, said contact pins being simultaneously insertable through said guide holes and being brought into resilient contact with said receptacle contact, a contact pressing member having partition walls and being slidingly mounted on said housing between an upper position and a lower position, said partition walls being positioned at said parallel portions of the receptacle contacts when said contact pressing member is in said lower position so that the first, second and third gaps between said portions of said receptacle contacts are wide enough to permit insertion of said contact pins with a contact force therebetween and, said partition walls being movable up to said widened portions of the receptacle contacts when said contact pressing member is moved to said upper position so that said second and third gaps are narrowed thereby pressing said receptacle contacts into firm contact with said contact pins and increasing the contact force, and said contact pressing member being provided at both side walls thereof with inclined guide grooves, respectively; and (c) means for simultaneously moving at least a portion of said contact pressing members including a plurality of sliding members slidably mounted on said mother board, each of said sliding members having projections which are engagable with said inclined guide grooves of said contact pressing members; and, a plurality of cam levers pivotably mounted on said mother board, each of said cam levers having one end engaged with at least one of said sliding members; and, (d) a detachably operating means for pivotally moving at least one of the plurality of cam levers, said contact pressing members being movable up and down in response to movement of said cam levers and said sliding members.

11. An electrical connector as set forth in claim 10, wherein said cam levers are connected to each other by a common bar so that said plurality of cam levers are pivotally moved simultaneously and said operating means is detachably attached to said common bar, said contact pressing members of all of said jack modules being movable up and down by a single operation.

12. An electrical connector as set forth in claim 10, wherein a plurality of pairs of said sliding members are slidably disposed along both sides of said jack modules, each pair of said sliding members being connected to an adjacent pair of sliding members and being engaged with at least one of said plurality of cam levers, and said operating means being detachably connected to each individual cam lever, said contact pressing members of at least one of a plurality of rows of said jack modules being movable up and down by a single operation.

13. An electrical connector as set forth in claim 10, wherein each of said cam levers is provided at said one end with at least one shaft having a cylindrical, circular cross-section shape and extending in parallel to an axis about which said cam lever is pivotally moved, each of said sliding members having a U-shaped groove for engaging said cam lever shaft, said sliding members being movable in response to pivotable movement of said cam lever.

* * * * *